United States Patent
Stamsnijder et al.

(10) Patent No.: US 10,580,613 B2
(45) Date of Patent: Mar. 3, 2020

(54) SAMPLE STAGE

(71) Applicant: Phenom-World Holding B.V., Eindhoven (NL)

(72) Inventors: Gerhardus Bernardus Stamsnijder, Eindhoven (NL); Paul Cornelis Maria van den Bos, Eindhoven (NL); Ton Antonius Cornelis Henricus Kluijtmans, Eindhoven (NL); Sander Richard Marie Stoks, Eindhoven (NL); Adrianus Franciscus Johannes Hammen, Eindhoven (NL); Karel Diederick van der Mast, Eindhoven (NL)

(73) Assignee: Phenom-World Holding B.V., Eindhoven (NL)

( * ) Notice: Subject to any disclaimer, the term of this patent is extended or adjusted under 35 U.S.C. 154(b) by 0 days.

(21) Appl. No.: 16/430,257

(22) Filed: Jun. 3, 2019

(65) Prior Publication Data

US 2019/0287756 A1   Sep. 19, 2019

Related U.S. Application Data

(63) Continuation of application No. 15/526,676, filed as application No. PCT/NL2015/050790 on Nov. 11, 2015.

(30) Foreign Application Priority Data

Nov. 12, 2014 (NL) ...................................... 2013783

(51) Int. Cl.
*H01J 37/20* (2006.01)
*H01J 37/18* (2006.01)
*H01J 37/28* (2006.01)

(52) U.S. Cl.
CPC .............. *H01J 37/20* (2013.01); *H01J 37/18* (2013.01); *H01J 37/185* (2013.01); *H01J 37/28* (2013.01); *H01J 2237/204* (2013.01); *H01J 2237/2006* (2013.01); *H01J 2237/20221* (2013.01);
(Continued)

(58) Field of Classification Search
CPC .......... H01J 37/20; H01J 37/18; H01J 37/185; H01J 37/28; H01J 2237/20; H01J 2237/2007; H01J 2237/202; H01J 2237/20207; H01J 2237/20247;
(Continued)

(56) References Cited

U.S. PATENT DOCUMENTS 5,252,884 A * 10/1993 Dona ...................... B23Q 1/34
                                                          310/328
5,660,381 A *  8/1997 Suzuki ................... G03F 7/707
                                                          269/329

(Continued)

FOREIGN PATENT DOCUMENTS

EP   19950101645   8/1995

*Primary Examiner* — Nicole M Ippolito
*Assistant Examiner* — Sean M Luck (57) ABSTRACT

Sample stage, e.g. for use in a scanning electron microscope. The sample stage includes a base, a sample carrier, and an actuator assembly arranged for moving the sample carrier in at least one direction substantially parallel to the base. The actuator assembly is arranged so as not to contribute to the mechanical stiffness of the sample stage from the sample carrier to the base.

19 Claims, 3 Drawing Sheets

(52) U.S. Cl.
CPC ............... *H01J 2237/20228* (2013.01); *H01J 2237/20235* (2013.01)

(58) Field of Classification Search
CPC ... H01J 2237/20221; H01J 2237/20228; H01J 2237/20235
See application file for complete search history.

(56) References Cited

U.S. PATENT DOCUMENTS

| | | | | |
|---|---|---|---|---|
| 5,684,856 A * | 11/1997 | Itoh | .................... | G03F 7/70716 250/453.11 |
| 5,744,924 A * | 4/1998 | Lee | .................... | G03F 7/70716 318/568.17 |
| 5,760,564 A * | 6/1998 | Novak | ................ | G03F 7/70716 318/687 |
| 5,806,193 A * | 9/1998 | Ebihara | ................... | B23Q 1/48 248/188.2 |
| 5,874,820 A * | 2/1999 | Lee | .................... | G03F 7/70358 318/575 |
| 6,324,933 B1 * | 12/2001 | Waskiewicz | ............ | B23Q 1/38 318/630 |
| 6,555,829 B1 * | 4/2003 | Spallas | ................... | B23Q 1/34 250/492.2 |
| 7,239,107 B1 * | 7/2007 | Ferreira | ................ | H02N 1/006 318/569 |
| 8,016,277 B2 * | 9/2011 | Choi | ...................... | B82Y 10/00 269/58 |
| 9,371,855 B2 * | 6/2016 | Voellmer | ................ | F16C 32/02 |
| 2002/0021427 A1 * | 2/2002 | Watson | ................... | F16C 11/12 355/53 |
| 2002/0021428 A1 * | 2/2002 | Nakano | ................... | H01J 37/20 355/53 |
| 2003/0213919 A1 * | 11/2003 | Hazelton | ............... | H01J 37/20 250/442.11 |
| 2005/0189901 A1 * | 9/2005 | Tanaka | .................. | B82Y 10/00 318/649 |
| 2009/0255447 A1 * | 10/2009 | Schubert | ............... | B82Y 10/00 108/143 |
| 2011/0260558 A1 * | 10/2011 | Shibahara | .............. | H01J 37/20 310/12.06 |

* cited by examiner

SAMPLE STAGE

This application is a continuation of U.S. application Ser. No. 15/526,676, filed May 12, 2017, which is a 35 U.S.C. § 371 national phase application of PCT/NL2015/050790 (WO 2016/076719), filed Nov. 11, 2015, entitled SAMPLE STAGE, which application claims the priority to Netherlands Application No. 2013783, filed Nov. 12, 2014, which is incorporated herein by reference in its entirety.

FIELD OF THE INVENTION

The present invention concerns a sample stage. More specifically the invention relates to a sample stage for use in an electron microscope. The invention also relates to a vacuum system, such as for use in an electron microscope. The invention also relates to an improved load lock.

BACKGROUND TO THE INVENTION

Sample stages are commonly used for moving a sample relative to a reference position. The reference position can e.g. be related to a field of view of a microscope such as a scanning electron microscope. The reference position can e.g. be an optical axis or a beam position. The sample stage allows positioning and repositioning of the sample relative to the reference position, e.g. to allow inspection of certain features of the sample, or to allow inspection of a surface area larger than the field of view.

A load lock forms a port between the inside atmosphere of an apparatus, such as an electron microscope, and the outside atmosphere. Load locks are commonly used when samples are inspected under modified atmosphere, e.g. in a vacuum, for allowing multiple samples to be inspected sequentially while minimizing upsetting of the modified atmosphere during loading and unloading of the subsequent samples.

SUMMARY OF THE INVENTION

In general it is desirable to be able to position a sample relative to a reference position, e.g. by moving a sample carrier relative to a base by means of a sample stage. The base can be fixedly positioned relative to the reference position. The sample can be positioned in X direction, and optionally in Y direction, and optionally in Z direction. It is also possible to, additionally, position the sample in rotational directions, such as a rotational direction R around an upright axis, and tilt directions T1 and T2. Herein X and Y represent two orthogonal directions parallel to the plane of the base, and Z is a direction orthogonal to X and Y. The tilt directions T1 and T2 normally represent rotations around axes that are orthogonal to the upright axis of rotation R, and that are mutually orthogonal.

When positioning a sample accuracy of the position and stability of maintaining the position is of great importance. It is often undesirable that the sample moves, e.g. vibrates within the field of view during observation of the sample. Thereto, the ability of the sample stage to maintain the position of a sample, positioned on a sample carrier of the sample stage, is of great importance. One important aspect herein is the mechanical stiffness of the sample stage from the sample carrier to the base. It is known that displacement mechanisms, e.g. guide rails (e.g. for positioning the sample carrier in X, Y and/or Z directions), or rotation mechanisms (e.g. for rotating the sample carrier in R, T1 and/or T2 directions), can reduce the overall mechanical stiffness of the sample stage. In the past much effort has been put into designing displacement mechanisms and rotation mechanisms with high mechanical stiffness.

Common sample stage designs use an X-stage, i.e. a displacement mechanism for linear displacement in the X direction, mounted to the base, a Y-stage, i.e. a displacement mechanism for linear displacement in the Y direction stacked on top of the X-stage, and a sample carrier stacked on top of the Y-stage. The inventors realized that such stacked design can significantly reduce the overall stiffness of the sample stage. This is exacerbated when the sample stage includes movement mechanisms for more degrees of freedom, e.g. X, Y, Z, R, T1 and T2 in stacked design. In accordance with an aspect of the invention there is provided a sample stage including a base, a sample carrier, an actuator assembly arranged for moving the sample carrier in two different directions substantially parallel to the base. The sample stage includes a two-dimensional slide bearing arranged for allowing the sample carrier to slide in two different directions in a plane parallel to the base. This provides the advantage that the two different movements of the sample carrier relative to the base are made possible with a single two-dimensional slide bearing, which significantly increases stiffness of the sample stage from the sample carrier to the base. The two different directions substantially parallel to the base can e.g. be a translation and a rotation, or two orthogonal translations. It will be clear that moving the sample carrier in two orthogonal directions substantially parallel to the base can be done by using two orthogonal actuators, e.g. a first actuator acting in the X direction and a second actuator acting in the Y direction. It is also possible that moving the sample carrier in two orthogonal directions substantially parallel to the base is done by using two non-orthogonal actuators, e.g. a first actuator acting in the X-direction, and a second actuator at 45 degrees to the X-axis. It is also possible that moving the sample carrier in two orthogonal directions substantially parallel to the is base done by using a linear and a rotational actuator; e.g. a first actuator acting in the R-direction, and a second actuator acting in the radial direction. Optionally, the actuator assembly is further arranged for rotating the sample carrier about an axis that is orthogonal to the base, and the two-dimensional slide bearing is further arranged for allowing the sample carrier to rotate about the axis orthogonal to the base.

In accordance with an aspect of the present invention there is provided a sample stage including a base, a sample carrier positioned on the base and an actuator assembly arranged for moving the sample carrier in a direction substantially parallel to the base. The actuator assembly is positioned such that it does not contribute to the mechanical stiffness of the sample stage from the sample carrier to the base. The actuator assembly can be connected to the sample carrier through a connection that is flexible in a direction orthogonal to the base. The inventors realized that rather than trying to increase the stiffness of the actuator assembly, such as an X-stage and Y-stage, it is beneficial to connect the actuator assembly, such as the X-stage and/or the Y-stage, to the sample carrier through a connection that is flexible in a direction orthogonal to the base. This flexibility allows for the sample carrier to freely move relative to the actuator in the direction orthogonal to the base. This in turn allows the sample carrier to abut against the base, e.g. by gravity or another biasing force, such as a spring force, a magnetic force, a pneumatic force, or the like. This also allows the position actuator assembly, such as the X-stage and the Y-stage, to be not interposed between the sample carrier and the base. Hence, the mechanical stiffness of the actuator assembly, such as the X-stage and the Y-stage, effectively plays no role in the mechanical stiffness of the sample stage from the sample carrier to the base.

It will be appreciated that herein the flexibility of the connection can be achieved by resilience: the connection can e.g. include a leaf spring extending substantially parallel to the base or a living hinge. It will be appreciated that herein the flexibility of the connection can alternatively, or additionally, be achieved by articulated connection: the connection can e.g. include a hinged connection. It will be appreciated that herein the flexibility of the connection can alternatively, or additionally, be achieved by play: the connection can e.g. include play in a direction orthogonal to the base.

According to an aspect of the invention, the connection of the actuator to the sample carrier is substantially rigid in the direction for moving the sample carrier. Optionally, the connection of the actuator to the sample carrier is substantially rigid in the direction for moving the sample carrier in both senses (e.g. forward and backward, left and right, positive X direction and negative X direction, positive Y direction and negative Y direction). Hence, the actuator assembly can accurately position the sample carrier in the moving direction. The person skilled in the art can easily determine the required rigidity for achieving a desired positioning accuracy, considering positioning speeds, accelerations, friction and the like. Alternatively, or additionally, the sample stage may include a position sensor for determining a position of the sample carrier relative to the base. The position sensor may e.g. determine a position in the X direction and in the Y direction. It will be appreciated that when the position of the sample carrier is being determined it can be allowed that the connection of the actuator assembly to the sample carrier in the direction for moving the sample carrier is less rigid since positioning accuracy can be achieved through closed loop control on the basis of the deter mined position.

Optionally, the actuator assembly is positioned beside the sample carrier. This provides the advantage that the actuator assembly is not interposed between the sample carrier and the base. Moreover, this allows for simple mechanical layout of the sample stage.

Optionally, the sample carrier is positioned against the base. When the sample carrier abuts against the base, a high mechanical stiffness of the sample stage from the sample carrier to the base can be realized.

Optionally, the sample carrier is slidingly positioned against the base. This provides the advantage that the sample carrier can easily be moved relative to the base in directions parallel to the base, while maintaining a high mechanical stiffness of the sample stage from the sample carrier to the base. Thereto, the sample carrier can include at least one sliding surface, e.g. sliding feet. Also the base may be provided with a sliding surface, such as a smooth surface.

The sample carrier can e.g. be slidingly moved in a first direction substantially parallel to the base. Possibly the sample carrier can also be slidingly moved in a second direction substantially parallel to the base, wherein the second direction is different from the first direction, e.g. orthogonal to the first direction. Possibly the sample carrier can be slidingly rotated around an axis that is orthogonal to the base. More in general, the actuator assembly is arranged for moving the sample carrier in a first direction substantially parallel to the base and optionally in a second and/or third direction substantially parallel to the base, wherein the first direction is different from the second and/or third direction.

According to an aspect of the invention the sample carrier includes a sample holder for holding a sample. Optionally the sample holder is a replaceable sample holder. This provides the advantage that the sample can be prepared and mounted to the sample holder while the sample holder is not in or on the sample carrier. Hence a plurality of sample holders can be prepared and exchanged at will.

According to an aspect of the invention the sample carrier is positioned within a vacuum chamber having a loading door. This provides the advantage that sample can be loaded onto or off the sample carrier through the loading door. This allows for rapid exchange of the sample by another sample. It is for instance possible to unload a first sample holder holding a first sample through the loading door and to load a second sample holder holding a second sample through the loading door into or onto the sample carrier.

The invention also relates to an improved load lock. Thereto according to the invention is provided a sample stage arranged to be positioned within a vacuum chamber having a loading door. The sample stage includes a base, a sample carrier, and an actuator assembly arranged for moving the sample carrier in a positioning direction substantially parallel to the base. Hence the sample carrier can be moved substantially parallel to the base, e.g. for moving a sample into and out of a field of view, and/or for positioning a sample relative to a reference position. The sample carrier is further movable towards the loading door in a loading direction, different from the positioning direction. The loading direction can be orthogonal to the base or have a component orthogonal to the base. The sample carrier can be pressed against a wall of the vacuum chamber, in sealing engagement, so as to allow access to the sample carrier via the loading door. It is possible that the actuator assembly for moving the sample carrier in a direction substantially parallel to the base is connected to the sample carrier through a connection that is flexible in the loading direction, e.g. in a direction orthogonal to the base.

Optionally, the sample carrier includes a sealing element positioned such that the sample carrier can be sealingly pressed against a wall of the vacuum chamber so as to allow access to the sample carrier via the loading door.

Optionally, the sample carrier includes a bottom and a circumferential wall enclosing a cavity for holding a sample or a sample holder, wherein the sealing member is positioned on the circumferential wall, e.g. on a leading edge of the circumferential wall. The sealing member can e.g. be an O-ring.

The movement of the sample carrier in the loading direction can be effected by means of a pushing device for sealingly pressing the sample carrier against the wall of the vacuum chamber. The pushing device can e.g. include bellows. The pushing device can be operated electrically, magnetically, hydraulically or pneumatically, e.g. using compressed air. Optionally, the pushing device is operated by vacuum and/or ambient air pressure.

The invention also relates to a vacuum system including a vacuum chamber having a loading door and at least one sample stage as described hereinabove, wherein the sample carrier is positioned within a vacuum chamber. Optionally, the actuator assembly is positioned inside the vacuum chamber.

The invention also relates to a scanning electron microscope including such vacuum system. The scanning electron microscope can e.g. be designed as a desktop scanning electron microscope.

The scanning electron microscope further includes an electron optical column connected to the vacuum chamber, wherein the base is or is connected to a wall of the vacuum chamber opposite the electron optical column. Alternatively, or additionally, the base is or is connected to a wall of the vacuum chamber to which the electron optical column is connected.

The invention also relates to a method for positioning a sample carrier. The method includes providing a base and positioning a sample carrier positioned on the base. The method includes moving the sample carrier in a direction substantially parallel to the base using an actuator assembly connected to the sample carrier through a connection that is flexible in a direction orthogonal to the base.

The invention also relates to a method for loading a sample into a vacuum chamber. The method includes moving a sample holder towards a preloading position adjacent to a loading door of the vacuum chamber in a first moving direction. The method includes sealingly pressing the sample holder against the wall of the vacuum chamber surrounding the loading door in a second direction, wherein the second direction is different from the first direction. The second direction can be orthogonal to, or have a component orthogonal to, the first direction. The method includes opening the loading door.

The invention also relates to a system for displaying a live microscope image, such as a scanning electron microscope image. The system includes a processor having a first input for receiving live images. The system includes an output for outputting live images to a display device. It will be appreciated that the output live images may be slightly lagging behind the received live images. The time lag is preferably sufficiently small to allow visual feedback of sample manipulation to an operator. Preferably, the time lag is less than 1 second, more preferably less than 0.5 second, most preferably less than 0.1 second. The processor is arranged for generating a live image of a first type from a first number of recent images received at the first input. The first number is preferably larger than one, e.g. two, four, eight, sixteen, twenty-four, thirty-two, or any other number. The processor is further arranged for outputting the live image of the first type to the output.

The live image of the first type can e.g. be an averaged image, averaged from the first number of most recent images received at the first input. Such averaged image can be output as improved live image.

Generating the live image of the first type from the first number of recent images received at the first input provides the advantage of providing sharper images, better contrast, less noise, etc. For example, a moving average, using a predetermined number of images to be averaged, can be used to allow the output averaged image to adapt when a region of interest changes, e.g. when the sample is moved relative to the microscope for observing a different portion of the sample. The inventors found, however, that such adapting of the moving averaged output image can be slow, which upsets user experience and may inhibit searching for artefacts on a sample surface.

In order to enhance the user experience, and to increase reaction speed of the system when displaying live images during changes to a region of interest, the inventors realized that it is beneficial that the processor includes a second input for receiving process information representative of changes to a condition of the microscope, and that the processor is further arranged for automatically, in response to receiving on the second input an indication of a change to the condition of the microscope, switch to outputting to the output a live image of a second type based on a second number of recent images received at the first input, the second number being smaller than the first number. Since the live image of the second type is based on a smaller number of recent images received at the first input effects of the change to the condition of the microscope, such as motion artefacts, to the live image of the second type will be smaller than to the live image of the first type. Conversely, since the live image of the second type is based on a smaller number of recent images received at the first input image improvement of the live image of the second type will be smaller than image improvement of the live image of the first type.

In a special embodiment, the second number is one. In that case each image of the live image of the second type is based on a single image received at the first input. Hence, in that case the live image of the second type substantially corresponds to the live image received at the first input. It will be appreciated that nevertheless the processor may apply image improvement techniques such as for example speckle removal, contrast/brightness enhancement or the like.

If the live image of the first type is a moving average based on the first number of received images, then the live image of the second type can be obtained by resetting the moving averaging.

The live image of the first type may e.g. be obtained by Kalman filtering, wherein the live image of the first type to be output at the output is calculated by multiplying the image most recently received at the first input by a Kalman gain, Kk, (O<Kk:S 1) and adding the immediately preceding output image multiplied by 1-Kk. The live image of the second type can then be obtained by Kalman filtering using a larger Kalman gain Kk than for the live image of the first type, e.g. a Kalman gain of 1.

The change to the condition of the microscope can relate to a change of region of interest. The change to a region of interest can relate to one or more of a change in sample position (e.g. X, Y and/or Z), a change in sample orientation (e.g. R, T1 and/or T2), a change in focal depth, and a change in magnification M. The change to the condition of the microscope can also relate to one or more of a change in electron acceleration voltage, a change in electron beam current, a change in beam tilt, a beam shift, a change in scan rotation, a change in electron gun tilt, an electron gun shift, a change in astigmatism correction, a change in vacuum pressure, and a change in temperature.

Hence, the outputting of the live image of the first type is automatically, temporarily, disabled during changes to the condition of the microscope. The outputting of the live image of the first type can automatically be resumed as soon as the changes to the condition of the microscope stop.

According to an aspect is provided a method for displaying a live microscope image, such as a scanning electron microscope image. The method includes receiving a stream of live images, generating a live image of a first type from a first number of most recent received images, and outputting the live image of the first type. The method includes in response to receiving an indication of a change to the condition of the microscope; outputting a live image of a second type based on a second number of recent images received at the first input, the second number being smaller than the first number.

BRIEF DESCRIPTION OF THE DRAWINGS

Embodiments of the present invention will now be described in detail with reference to the accompanying drawings in which:

FIG. 6 is a flow chart of a process according to an aspect of the

DETAILED DESCRIPTION

Figure 1:
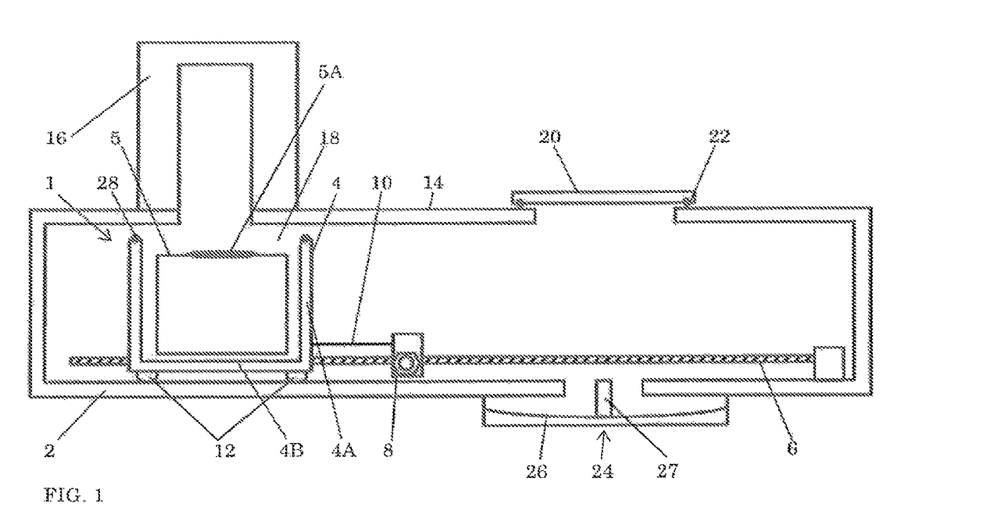
FIG. 1 is a schematic representation of a system having aspects according to the invention.

FIG. 1 shows a schematic representation of a system having aspects according to the invention. FIG. 1 shows, by way of non-limiting example a schematic representation of a scanning electron microscope. FIG. 1 shows a sample stage 1 positioned inside a vacuum chamber 14. The sample stage 1 includes a sample carrier 4. In this example the sample carrier 4 includes a bottom 4A and a circumferential wall 4B enclosing a cavity 18 for holding a sample or a sample holder. In this example the cavity 18 holds an exchangeable sample holder 5. The exchangeable sample holder 5 holds a sample 5A.

The sample stage 1 further includes a base 2. The sample carrier 4 is positioned on the base 2. In FIG. 1 the sample carrier 4 includes sliding feet 12 for allowing sample carrier 4 to slidingly move along the surface of the base 2. Since the sample carrier 4 directly abuts against the base 2, and here is pressed against the base by gravity, the mechanical stiffness of the sample stage 1 from the sample carrier 4 to the base 2 can be made very high. The sliding feet can be chosen of a material having a suitable Young's module, and can have dimensions (surface area and thickness) to provide high stiffness in the upright direction. This construction also provides a high stiffness of the sample stage 1 from the sample carrier 4 to the base 2 in directions parallel to the surface of the base 2.

The sample stage 1 further includes an actuator assembly. In FIG. 1 the actuator assembly includes a first actuator 6 arranged for moving the sample carrier 4 in a direction substantially parallel to the base 2. In this example the first actuator 6 includes a screw spindle for moving the sample carrier from left to right in the Figure, henceforth X direction. The actuator assembly further includes a second actuator 8 arranged for moving the sample carrier 4 in a direction substantially parallel to the base 2 and substantially orthogonal to the moving direction of the first actuator 6. In this example the second actuator 8 includes a screw spindle for moving the sample carrier in a direction into and out of the paper in the Figure, henceforth Y direction. In this example the second actuator 8 is connected to the actuated part of the first actuator 6. Thus, the "steady" part of the second actuator 8 can be moved in X direction by the first actuator 6. Hence, the actuated part of the second actuator 8 can be moved in X and Y direction. The actuated part of the second actuator 8 is connected to the sample carrier by means of connection 10. Thus, together the first and second actuators 6, 8 are arranged for moving the sample carrier 4 in X and Y direction. Thus, in effect the sample stage 1 includes a two-dimensional slide bearing arranged for allowing the sample carrier 4 to slide in two different, in this example orthogonal, directions in a plane parallel to the base 2. It will be appreciated that it is also possible that the actuator assembly includes a third actuator for rotating the sample carrier about an axis that is orthogonal to the base 2, hereinafter referred to as rotation in the R direction. The slide bearing is also arranged for allowing the sample carrier 4 to rotate about the axis orthogonal to the base 2.

The connection 10 is flexible in a direction orthogonal to the base 2. In this example, the connection 10 includes a leaf spring. The flexibility in the direction orthogonal to the base 2 takes care that the first and second actuators 6, 8 cannot force the sample carrier in the direction orthogonal to the base. Any residual forces exerted by the first and second (and third) actuators 6, 8 in the direction orthogonal to the base 2 are dissipated by the flexible connection 10. Thus, the mechanical stiffness of the sample stage 1 from the sample carrier 4 to the base 2, i.e. in FIG. 1 the mechanical stiffness in vertical direction, is independent of any mechanical stiffness of the first and second (and third) actuators 6, 8. It will be appreciated that in this example the first and second actuators are not interposed between the sample carrier 4 and the base 2. This too renders the mechanical stiffness of the sample stage 1 from the sample carrier 4 to the base 2 independent of any mechanical stiffness of the first and second actuators 6, 8. In this example the first and second actuators 6, 8 are positioned beside the sample carrier 4, outside the contour of the sample carrier 4 when viewed from above. It will be appreciated that it is also possible that the second actuator 8 is interposed between the sample carrier 4 and the base 2. In such case, preferably, the sample carrier 4 still abuts against the base 2 by sliding feet straddling the second actuator 8, so as to exclude the second actuator 8 from determining the mechanical stiffness of the sample stage 1 from the sample carrier 4 to the base 2.

The connection 10 is substantially rigid in the X and Y directions (and in the R direction). It will be appreciated that the connection 10 is rigid in both the positive X direction and the negative X direction. Hence, the connection 10 is substantially rigid in the X direction in both senses. It will be appreciated that the connection 10 is rigid in both the positive Y direction and the negative Y direction. Hence, the connection 10 is substantially rigid in the Y direction in both senses. It will be appreciated that the leaf spring has a high stiffness in the plane in which it extends. Hence, the actuators 6, 8 can accurately position the sample carrier 4 in the X and Y directions. It will be appreciated that the rigidity for achieving a desired positioning accuracy can easily be determined, taking into account positioning speeds, accelerations, friction and the like. Alternatively, or additionally, the sample stage 1 may include a position sensor for determining a position of the sample carrier 4 relative to the base 2. The position sensor may e.g. determine a position in the X direction and in the Y direction. It will be appreciated that when the position of the sample carrier 4 is being determined it can be allowed that the connection of the actuators 6, 8 to the sample carrier 4 in the X and Y directions is less rigid since positioning accuracy can be achieved through closed loop control on the basis of the determined position.

The system shown in FIG. 1 further includes an electron optical column 16. The electron optical column 16 includes an electron gun for generating an electron beam, and lenses for the beam, for forming an image of the sample 5A in a manner known per se. In FIG. 1 the base 2 is formed by a wall of the vacuum chamber 14 opposite the electron optical column 16. It is also possible that the base 2 is formed by or is positioned on a wall of the vacuum chamber 14 to which the electron optical column 16 is mounted. If this wall is the upper wall, the sample carrier 4 may be biased towards the base 2 by a biasing force, such as a spring force, a magnetic force, a pneumatic force, or the like.

The system shown in FIG. 1 further includes a loading door 20. The loading door 20 sealingly closes a loading aperture of the vacuum chamber 14. In FIG. 1 the loading door 20 includes a sealing member 22, e.g. an O-ring. The vacuum chamber is maintained at a low pressure, of e.g. 0.3 mbar, when operating the electron optical column 16. It will be appreciated that opening the loading door 20 in the system in the state of FIG. 1 for loading or unloading a sample (holder) would allow ambient air (approximately 1000 mbar) to enter the entire vacuum chamber 14. As a result a long pumping time would be required to achieve a suitable vacuum for operating the electron optical column again. Moreover, critical parts of the electron microscope, such as the electron gun, could be damaged when subjected to such high pressures. In order to reduce the pump time, and protect the critical parts, a load lock can be used. FIGS. 1-4 illustrate how the system can be used to provide load lock functionality.

Figure 2:
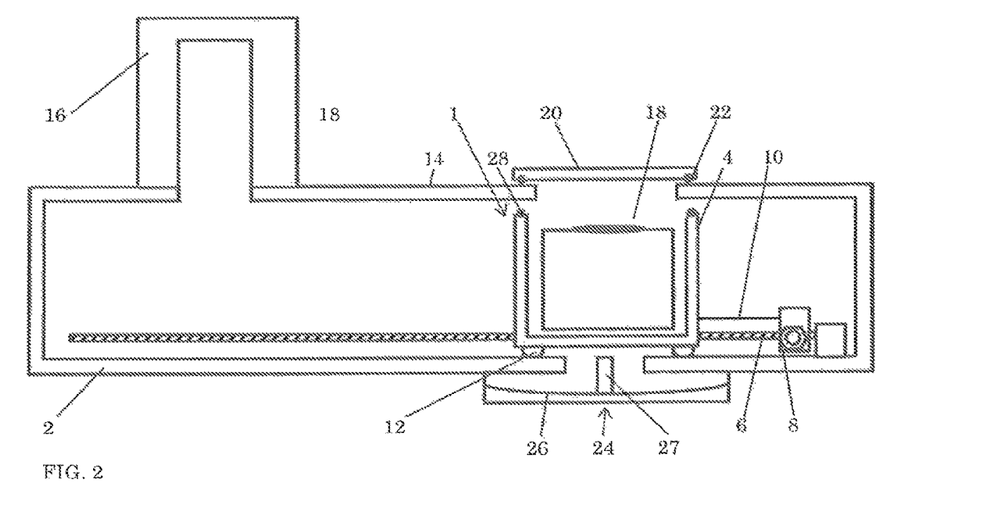
FIG. 2 is a schematic representation of a system having aspects according to the invention.

In FIG. 2, the sample carrier 4 is moved towards a preloading position adjacent to the loading door 20 by the first and second actuators 6, 8. This movement of the sample carrier 4 from the inspection position underneath the electron optical column (FIG. 1) to the preloading position underneath the loading door 20 (FIG. 2) is substantially parallel to the base 2.

Figure 3:
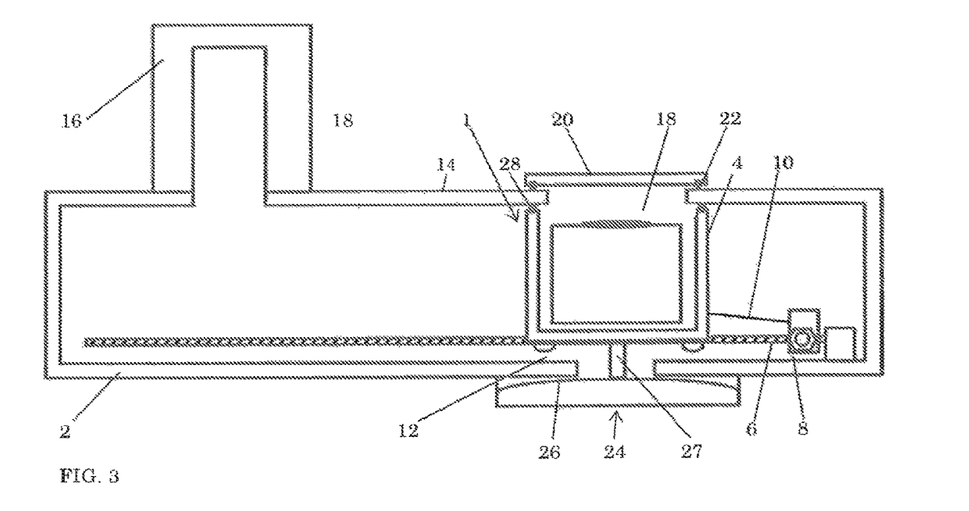
FIG. 3 is a schematic representation of a system having aspects according to the invention.

In FIG. 3 the sample carrier 4 is moved in a direction parallel to the base 2. The sample carrier 4 is sealingly pressed against the wall of the vacuum chamber 14 surrounding the loading door 20. In this example the sample carrier 4 has a sealing member 28, e.g. an O-ring, for providing a sealing engagement between the sample carrier 4 and the wall of the vacuum chamber 14, such that the cavity 18 of the sample carrier can be accessed through the loading door 20. The system includes a pushing device 24 for sealingly pressing the sample carrier 24 against the wall of the vacuum chamber 14.

In this example the pushing device 24 includes a bellows 26. In the system state in FIG. 2 the space below the bellows 26 is maintained at a low pressure, e.g. the same pressure as inside the vacuum chamber 14. As a result a pusher 27 is maintained in a retracted position. In the system state in FIG. 3 the space below the bellows 26 is maintained at a high pressure, e.g. at ambient pressure or at an elevated pressure. As a result, the pusher 27 is brought in an extended position and pushes the sample carrier 4 in sealing engagement with the wall of the vacuum chamber 14.

Figure 4:
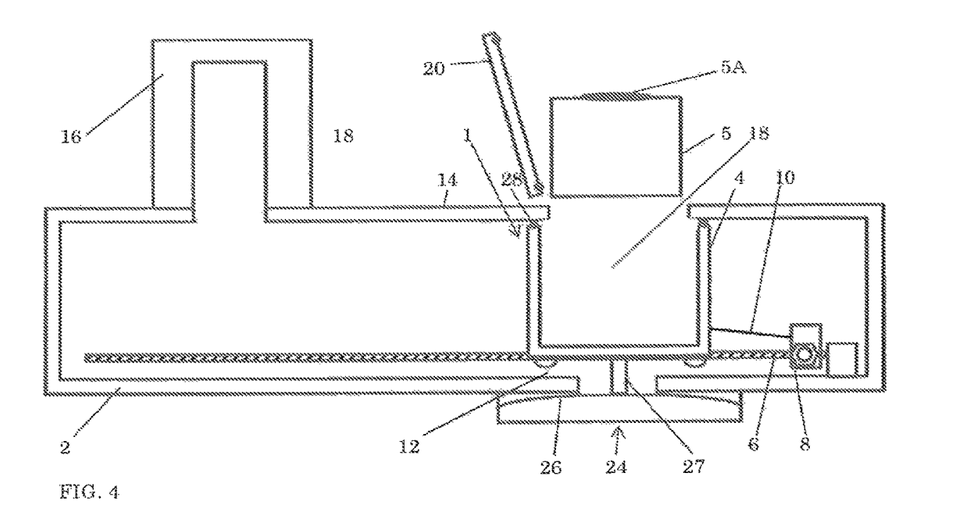
FIG. 4 is a schematic representation of a system having aspects according to the invention.

In FIG. 4 the loading door 20 is opened. The sample holder 5 and/or the sample 5A can be unloaded from the sample carrier 4. It is also possible to load a sample holder 5 and/or sample 5A into the sample carrier 4. While the loading door 20 is opened the pressure inside the cavity will be ambient pressure. It will be appreciated that the downward force on the sample carrier 4 due to the ambient pressure inside the cavity 18 must be counteracted by the upward force generated by the bellows 26 to maintain the sealing engagement between the sample carrier 4 and the wall of the vacuum chamber 14 surrounding the loading door 20. As can be seen in FIGS. 1-4 in this example the surface area of the bellows is chosen to be larger than the surface area of the sample carrier (in top view). Such larger surface area of the bellows 26 will bias the sample carrier 4 towards the sealing position.

As can be seen in FIGS. 3 and 4 the flexible connection 10 also allows for lifting to of the sample carrier 4 towards the loading door 20 while the sample carrier remains connected to the actuators 6, 8.

After loading a sample holder 5 or a sample 5A the loading door 20 is closed again (see FIG. 3). Next, the pressure in the cavity 18 is reduced. Thereto, a vacuum pump or prevacuum pump of the system has a connection to the cavity 18. Once the pressure in the cavity is reduced, for example to 4.5 mbar, the sample carrier 4 is lowered again (see FIG. 2). This causes the remaining air in the cavity 18 to spread throughout the vacuum chamber 14. Since the volume of the cavity 18 can be chosen to be small relative to the volume of the vacuum chamber 14, this has a reduced effect on the pressure inside the vacuum chamber 14. The pressure in the vacuum chamber 14 may e.g. rise to 0.5 mbar. Next, the vacuum chamber 14 is pumped to the desired pressure for operation of the electron optical column again, e.g. 0.3 mbar.

The sample carrier 4 as described above can be positioned relative to a reference position. The reference position can e.g. be an optical axis or beam position of the electron optical column 16. Moving the sample carrier 4 relative to the reference position allows different areas of the sample 5A to be brought into the field of view of the microscope. The electron optical column 16 generates an image of the sample 5A within the field of view. This image can e.g. be displayed at a computer screen of the system.

More in general, the microscope includes an image generator 30. The image generator 30 can be a CCD camera CMOS, or an other type of image sensor, see FIG. 5. For displaying image, the system includes a processor 32 having a first input 34 for receiving images, such as live images. The images are fed to an output 36 by the processor. The output communicates with a display unit 40 such as a computer screen. The processor 32 is arranged for improving the image quality of the live image fed to the output 36. Thereto, the processor 32 can be arranged for generating a live image of a first type from a first number of recent images received at the first input.

Figure 5:
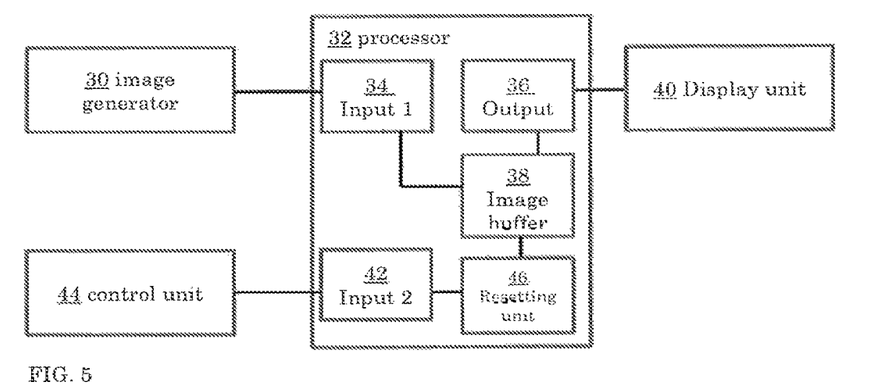
FIG. 5 is a schematic representation of a system having aspects according to the invention.

The live image of the first type can for example be an averaged image. The input images to be averaged may e.g. be temporarily be stored in an image buffer 38. In the image buffer 38 the images can be processed prior to being displayed. In order to providing sharper images, better contrast, less noise, etc. the image output towards the display device may be obtained by averaging the first number of images in the image buffer 38. It is for instance possible to calculate a moving average of a predetermined number of images: every image newly received at the first input 34 then replaces the oldest image in the calculation of the averaged image.

In an alternative embodiment, the live image of a first type can be calculated on the basis of Kalman filtering. In this case an image to be fed to the output 36 is calculated by multiplying the image most recently received at the first input 34 by a Kalman gain, Kk, (O<Kk ::::; 1) and adding the immediately preceding output image multiplied by 1-Kk. The Kalman gain Kk represents the proportional contribution of the image most recently received at the first input 34 to the image output at the output 36. In an example, the live image of the first type may be calculated by setting the Kalman gain to $\frac{1}{16}$. It is noted that the Kalman filtering does not necessitate the use of the buffer 38.

Displaying the live image of the first type provides increased image quality at the display unit while observing a sample under constant conditions. However, when conditions change, e.g. when the sample is moved to view another region, or when an image magnification is changed, the live image of the first type will at least partly be based on "old" images relating to the old condition (e.g. old sample position), and partly on one or more "new" images relating to the new condition (e.g. new sample position). This will introduce unsharpness, such as motion blur, into the displayed live image.

To resolve this, the processor 32 further includes a second input 42. The second input 42 is in communication with a control unit 44 of the microscope. The control unit 44 provides to the second input 42 an indication of a change to a condition of the microscope that can influence the obtained image. Such change of condition can relate to a change of region of interest. Such change of region of interest can include one or more of a change in sample position (e.g. X, Y and/or Z), a change in sample orientation (e.g. R, T1 and/or T2), a change in focal depth, and a change in magnification M. Such change in condition can also include one or more of a change in electron acceleration voltage, a change in electron beam current, a change in beam tilt, a beam shift, a change in scan rotation, a change in electron gun tilt, an electron gun shift, a change in astigmatism correction, a change in vacuum pressure, and a change in temperature.

When the processor, via the second input 42, receives a signal indicating a change in condition of the microscope, the processor 32 stops outputting the live image of the first type and automatically switches to outputting a live image of a second type. The live image of the second type is based on a second number of recent images received at the first input 34, the second number being smaller than the first number. The second number being smaller than the first number, the live image of the second type is less susceptible to artefacts such as motion blur. In a special embodiment the second number is one, so that the live image of the second type substantially corresponds to the live image received at the first input.

When the live image of the first type is obtained by averaging using the image buffer 38, the processor 32 in response to receiving a signal indicating a change in condition of the microscope can reset the image buffer 38. Hence, the averaging of images is automatically temporarily disabled when a change to the condition is detected. The resetting of the image buffer marks the outputting of the live image of the second type. It is noted that if no further change in a condition of the microscope occurs, and thus no further signal indicating such change is received at the second input 42, the averaging of images can automatically resumes as the reset image buffer 38 can immediately start to include multiple images which are again averaged. It will be appreciated that the resetting of the image buffer can be achieved by deleting images from the buffer, or by restarting calculation of the averaged image from the latest image.

When the live image of the first type is obtained by Kalman filtering, the processor 32 in response to receiving a signal indicating a change in condition of the microscope can increase the Kalman gain $K_k$. For example, the Kalman gain can be set to 1. A Kalman gain $K_k$ of 1 indicates that the image received at the first input 34 is fed to the output 36 without adding historical image data. The increasing of the Kalman gain $K_k$ marks the outputting of the live image of the second type. It is also possible that the Kalman gain $K_k$ for the live image of the second type is smaller than 1, e.g. $0.5 \leq K_k < 1$. It is noted that if no further change in a condition of the microscope occurs, and thus no further signal indicating such change is received at the second input 42, the Kalman gain can be decreased again, e.g. abruptly, stepwise or gradually. The reducing of the Kalman gain can be effected automatically when the processor 32 determines that no further signal indicating a change in a condition of the microscope is received at the second input 42.

Figure 6:
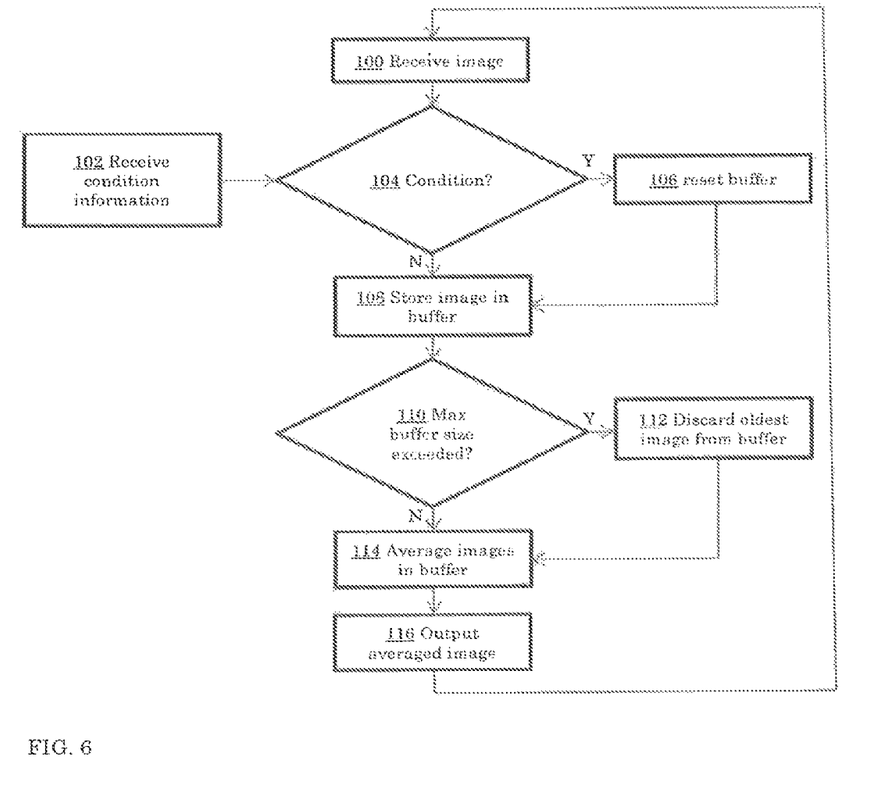

FIG. 6 shows a schematic representation of a flow chart describing a possible operation of the processor 32. In step 100 an image is received from the image generator 30 at the first input 34. In step 102 the second input is ready for receiving signals or messages indicating a change in a condition of the microscope. In step 104 the processor 32 check the second input 42 for receipt of signals or messages indicating a change in a condition of the microscope. If such signal or message has been received at the second input 42 the processor resets the image buffer in step 106. Next in step 108 the image received at the first input 34 is stored in the image buffer that still contains historic images or has been reset. If the predetermined number of images to be used for averaging in the image buffer has been exceeded (check in step 110) the oldest image is discarded from the buffer in step 112. It is noted that the predetermined number of images to be used for averaging can e.g. be set by a user, e.g. in a user interface of the system. In step 114 the images in the buffer are averaged. In step 116 the averaged image is output, e.g. to the display unit 40. Then the procedure restarts at step 100 for the next image.

It will be appreciated that the processor 32 and the associated process can be used in a scanning electron microscope, but also in a tunneling electron microscope or in an optical microscope. Alternatively, the processor 32 and the associated process can also be used in other devices such as telescopes, digital cameras, etc.

Herein, the invention is described with reference to specific examples of embodiments of the invention. It will, however, be evident that various modifications and changes may be made therein, without departing from the essence of the invention. For the purpose of clarity and a concise description features are described herein as part of the same or separate embodiments, however, alternative embodiments having combinations of all or some of the features described in these separate embodiments are also envisaged.

In the example of FIGS. 1-4 the pushing device 24 is stationary relative to the vacuum chamber 14. It will be appreciated that the pushing device can also be mobile relative to the vacuum chamber, e.g. mounted to the sample carrier 4, the first actuator 6, and/or the second actuator 8.

In the example the pushing device is operated by gas (e.g. vacuum, ambient air or pressurized air). It will be appreciated that it is also possible to operate the pushing device by means of an electric motor, magnet(s), piezo-electric crystal, hydraulics, manual force (e.g. via gears or levers), etc.

In the examples the load lock makes use of the flexible connection 10. It will be appreciated that the load lock can also be operated with the sample carrier vertically movably, but not necessarily flexibly, mounted to an intermediate part that rigidly couples to the actuator(s).

It will be appreciated that the sample stage with the flexible connection 10 can also be put to use independent of the load lock functionality.

In the example of FIGS. 1-4 the sample carrier is slidingly positioned on the base. Alternative positioning and movement mechanism are also possible. It is for instance possible to use a gas bearing system, e.g. with a biasing force (e.g. magnetic force or vacuum force). Such two-dimensional gas bearing system is herein also referred to as two-dimensional slide bearing. In the example of FIGS. 1-4 the sliding feet are static. It is also possible that the sliding feet are formed by rollers allowing two-dimensional sliding of the stage. Such two-dimensional rolling bearing system is herein also referred to as two-dimensional slide bearing.

In the above examples the sample stage is used in the context of a scanning electron microscope. It will be appreciated that the sample stage can also be used in other inspection apparatus, such as optical microscopes, tunneling electron microscopes, atomic force microscopes, etc. It will be appreciated that the sample stage can also be used in other apparatus, such as milling machines, grinding machines, routing machines, etching machines, (3D) printing machines, lithographic machines, component placement machines, or the like. It will be appreciated that the sample in such other apparatus can be an object being machined, a semiconductor wafer, a printed circuit board, or the like.

It will be appreciated that the processor, first input unit, output unit, image buffer, second input unit, control unit and resetting unit can be embodied as dedicated electronic circuits, possibly including software code portions. The processor, first input unit, output unit, image buffer, second input unit, control unit and resetting unit can also be embodied as software code portions executed on, and e.g. stored in, a memory of, a programmable apparatus such as a computer.

Although the embodiments of the invention described with reference to the drawings comprise computer apparatus and processes performed in computer apparatus, the invention also extends to computer programs, particularly computer programs on or in a carrier, adapted for putting the invention into practice. The program may be in the for in of source or object code or in any other form suitable for use in the implementation of the processes according to the invention. The carrier may be any entity or device capable of carrying the program.

For example, the carrier may comprise a storage medium, such as a ROM, for example a CD ROM or a semiconductor ROM, or a magnetic recording medium, for example a floppy disc or hard disk. Further, the carrier may be a transmissible carrier such as an electrical or optical signal which may be conveyed via electrical or optical cable or by radio or other means, e.g. via the internet or cloud.

When a program is embodied in a signal which may be conveyed directly by a cable or other device or means, the carrier may be constituted by such cable or other device or means. Alternatively, the carrier may be an integrated circuit in which the program is embedded, the integrated circuit being adapted for performing, or for use in the performance of, the relevant processes.

However, other modifications, variations, and alternatives are also possible. The specifications, drawings and examples are, accordingly, to be regarded in an illustrative sense rather than in a restrictive sense.

For the purpose of clarity and a concise description features are described herein as part of the same or separate embodiments, however, it will be appreciated that the scope of the invention may include embodiments having combinations of all or some of the features described.

In the claims, any reference signs placed between parentheses shall not be construed as limiting the claim. The word 'comprising' does not exclude the presence of other features or steps than those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to an advantage.

The invention claimed is:

1. A system for loading a sample, comprising:
   a vacuum chamber,
   a sample stage in the vacuum chamber, the sample stage including a base, a sample carrier, and a first actuator for moving the sample carrier in a first direction parallel to the base;
   a loading door sealingly closes a loading aperture of the vacuum chamber;
   a pushing device for pressing the sample carrier in a loading direction towards the loading door, the loading direction having a component orthogonal to the base; and
   a connector connecting the sample carrier and an actuated part of the first actuator, wherein the connector is flexible in the loading direction, the connector is connected to the actuated part of the first actuator when the sample carrier is pressed in the loading direction by the pushing device, and the actuated part of the first actuator does not move in the loading direction when the sample carrier is pressed in the loading direction by the pushing device.

2. The system of claim 1, wherein the pushing device is stationary relative to the vacuum chamber.

3. The system of claim 1, further includes a second actuator for moving the sample carrier in a second direction orthogonal to the first direction and parallel to the base, the first actuator is connected to an actuated part of the second actuator to move the first actuator in both the first direction and the second direction.

4. The system of claim 3, further includes a two-dimensional slide bearing arranged for allowing the sample carrier to move in the first direction and the second direction.

5. The system of claim 1, wherein the connector is rigid in the first direction.

6. The system of claim 1, wherein the connector is a leaf spring extends parallel to the base.

7. The system of claim 1, wherein the connector is an articulated connector including a living hinge.

8. The system of claim 1, wherein the sample carrier includes a bottom and a circumferential wall enclosing a cavity for holding a sample, and a sealing member, wherein the sealing member is positioned on the circumferential wall.

9. The system of claim 8, wherein the sample carrier is sealed against a wall of the vacuum chamber via the sealing member by pressing the sample carrier against the wall of the vacuum chamber surrounding the loading door.

10. The system of claim 1, wherein the sample carrier is positioned against the base.

11. The system of claim 1, wherein the loading direction is orthogonal to the base.

12. A method for loading a sample into a sample carrier within a vacuum chamber, comprising:
    moving the sample carrier in a first direction parallel to a base via a first actuator, wherein the sample carrier is connected to an actuated part of the first actuator via a connector;
    pressing the sample carrier in a loading direction toward a loading door via a pushing device to seal the sample carrier against a wall of the vacuum chamber surrounding the loading door, wherein the loading direction has a component orthogonal to the base, the connector is flexible in the loading direction, the connector is connected to the actuated part of the first actuator when the sample carrier is pressed in direction by the pushing device, the actuated part of the first actuator does not move in the loading direction when the sample carrier is pressed in the loading direction by the pushing device, and the loading door sealingly closes a loading aperture of the vacuum chamber;

opening the loading door after sealing the sample carrier against the wall of the vacuum chamber surrounding the loading door;

loading the sample into the sample carrier via the loading aperture;

closing the loading door after loading the sample; and lowering the sample carrier with the loaded sample towards the base.

13. The method of claim 12, wherein the pushing device includes a pusher, the sample carrier is pressed in the loading direction by extending the pusher, and the sample carrier is lowered towards the base by retracting the pusher.

14. The method of claim 12, further comprising moving the sample carrier in a second direction orthogonal to the first direction and parallel to the base via a second actuator, the first actuator is connected to an actuated part of the second actuator to move the first actuator in both the first direction and the second direction.

15. The method of claim 14, wherein the connector is rigid in the first direction and the second direction.

16. The method of claim 12, wherein the pushing device includes bellows.

17. The method of claim 12, wherein the pushing device is operated by vacuum and/or ambient air pressure.

18. The method of claim 12, wherein the pushing device is mobile relative to the vacuum chamber.

19. The method of claim 12, further comprising reducing a pressure in a cavity of the sample carrier after closing the loading door and before lowering the sample carrier towards the base.

* * * * *